(12) United States Patent
Kohashi (10) Patent No.: US 8,022,364 B2
(45) Date of Patent: Sep. 20, 2011

(54) ELECTRON SPIN DETECTOR, AND SPIN POLARIZED SCANNING ELECTRON MICROSCOPE AND SPIN-RESOLVED X-RAY PHOTOELECTRON SPECTROSCOPE USING THE ELECTRON SPIN DETECTOR

(75) Inventor: Teruo Kohashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 92 days.

(21) Appl. No.: 12/637,844

(22) Filed: Dec. 15, 2009

(65) Prior Publication Data

US 2010/0155598 A1    Jun. 24, 2010

(30) Foreign Application Priority Data

Dec. 22, 2008    (JP) ................................. 2008-325893

(51) Int. Cl.
*H01J 37/244*    (2006.01)
*H01J 37/28*    (2006.01)

(52) U.S. Cl. ......... 250/305; 250/251; 250/310; 250/311

(58) Field of Classification Search .................. 250/251, 250/305, 310, 311
See application file for complete search history.

(56) References Cited

U.S. PATENT DOCUMENTS

| | | | | |
|---|---|---|---|---|
| 3,968,376 A | * | 7/1976 | Pierce et al. ................ | 250/493.1 |
| 4,153,844 A | * | 5/1979 | Kirschner .................... | 324/71.3 |
| 4,658,138 A | | 4/1987 | Koike et al. | |
| 5,446,687 A | * | 8/1995 | Hurt et al. ..................... | 365/121 |
| 5,546,337 A | * | 8/1996 | Hurt et al. ..................... | 365/121 |
| 5,604,706 A | * | 2/1997 | Hurt et al. ..................... | 365/217 |
| 6,147,894 A | * | 11/2000 | Hurt .............................. | 365/118 |
| 6,583,410 B1 | * | 6/2003 | Seddon ......................... | 250/305 |
| 6,639,218 B2 | * | 10/2003 | Mukasa et al. .................... | 850/9 |
| 6,674,073 B2 | * | 1/2004 | Mukasa et al. .................. | 250/305 |
| 7,459,682 B2 | * | 12/2008 | Duan et al. ..................... | 250/306 |
| 7,755,046 B2 | * | 7/2010 | Kohashi et al. ............... | 250/311 |
| 2002/0003213 A1 | * | 1/2002 | Mukasa et al. ................ | 250/310 |
| 2007/0194230 A1 | * | 8/2007 | Kohashi et al. ............... | 250/310 |
| 2008/0210868 A1 | * | 9/2008 | Kohashi et al. ............... | 250/311 |
| 2008/0217533 A1 | * | 9/2008 | Kohashi ........................ | 250/310 |
| 2010/0155598 A1 | * | 6/2010 | Kohashi ........................ | 250/311 |

FOREIGN PATENT DOCUMENTS

JP    60-177539    9/1985
JP    2008-251525    10/2008

OTHER PUBLICATIONS

S. Qiao et al.; A new compact electron spin polarimeter with a high efficiency; Rev. Sci. Instrum., Dec. 1997; pp. 4390-4395; vol. 68, No. 12.
Th Dodt et al.; Spin and Energy Dependence of the Electron Current Absorbed by $_\alpha$-Fe(001) thin films.; Europhysics Letters; Jun. 15, 1988; pp. 375-379; vol. 6, No. 4.

(Continued)

*Primary Examiner* — David A Vanore
(74) *Attorney, Agent, or Firm* — Antonelli, Terry, Stout & Kraus, LLP.

(57) ABSTRACT

An electron spin detector includes plural magnetoresistive sensors and a deceleration lens of an electron beam, and each magnetoresistive sensor is inclined so that the electron beam spread by the deceleration lens can be input perpendicularly to the magnetoresistive sensor.

11 Claims, 8 Drawing Sheets

OTHER PUBLICATIONS

Takashi Furukawa et al.; Absorbed-Current Polarization Detector with Fe(110) Target; Jpn. J. Appl. Phys, Apr. 1993; pp. 1851-1854, vol. 32, Part 1, No. 4.

Henri-Jean Drouhin, Spin detectors operating in the medium-energy range; Journal of Applied Physics 97, 063702 (2005).

E Bauer et al.; Spin-polarized low energy electron microscopy of ferromagnetic thin films; Institute of Physics Publishing; Journal of Physics D: 35 (2002) pp. 2327-2331.

Teruo Kohashi et al.; A spin rotator for spin-polarized scanning electron microscopy; Review of Scientific Instruments; Jun. 2004; vol. 75, No. 6, pp. 2003-2007.

Naoshi Takahashi, et al.; Construction of a Compact Spin- and Angle-Resolved Photoelectron Spectrometer; Jpn. J Appl. Phys. Dec. 1996; pp. 6314-6319; vol. 35; Part 1, No. 12A.

* cited by examiner

ELECTRON SPIN DETECTOR, AND SPIN POLARIZED SCANNING ELECTRON MICROSCOPE AND SPIN-RESOLVED X-RAY PHOTOELECTRON SPECTROSCOPE USING THE ELECTRON SPIN DETECTOR

CLAIM OF PRIORITY

The present application claims priority from Japanese patent application JP 2008-325893 filed on Dec. 22, 2008, the content of which is hereby incorporated by reference into this application.

FIELD OF THE INVENTION

The present invention relates to a spectrometer that operates inside a vacuum chamber and detects spins of respective electrons.

BACKGROUND OF THE INVENTION

As an electron beam spin detector for use in a spin polarized scanning electron microscope (spin SEM) and a spin-resolved X-ray photoelectron spectroscope, there has been known a Mott detector which is lower in sensitivity than an electron detector by about four digits. For that reason, with an aim to improve the efficiency, a research has been pursued to devise a structure of the Mott detector in various laboratories (for example, S. Qiao, A. Kimura, A. Harasawa, M. Sawada, J. G. Chung, and A. Kakizaki, Rev. Sci. Instrum. 68, 4390 (1997)). However, under the existing circumstances, the efficiency is improved by about several times at the utmost, and a dramatic improvement would not be desirable in the future. As a spin detector of an entirely different type, there has been proposed a detector using a phenomenon in which a ferromagnetic body is irradiated with a spin-resolved electron beam, and a current absorbed by the ferromagnetic body at that time depends on the spin polarization degree of an incident electronic beam (for example, Th. Dodt, D. Tillmann, R. Rochow and E. Kisker, Europhys. Lett. 6, 375 (1988)). The principle of this detector derives from a fact that ease to enter an electron band structure of the ferromagnetic body is different depending on a direction of the electron spin. However, the sensitivity in this situation is slight higher in level than the Mott detector and lower than the normal electron detector by about three digits (for example, T. Furukawa and K. Koike, Jpn. J. Appl. Phys. 32, 1851 (1993)).

On the other hand, in recent years, the development of magnetoresistive sensors each having a multilayer structure which are expected to the application to a read head of a hard disc and an MRAM has been advanced. Those magnetoresistive sensors are devices that can detect the above-described difference of current caused by the direction of spin with high precision, and the use of those devices leads to a possibility that there can be developed a spin detector with dramatic high sensitivity which is the same level as that of the normal electron detector. In fact, experiments that suggest the above possibility have been conducted (for example, H.-J. Drouhin, J. Appl. Phys. 97, 063702 (2005)). Also, in contrast to the Mott detector that must accelerate an electron beam to be measured up to a level of 100 kV, an incoming voltage to the magnetoresistive sensor is desirably equal to or lower than 1 kV. For that reason, there is a possibility that the entire spin detector that is small in size and low in costs can be manufactured.

SUMMARY OF THE INVENTION

Figure 1:
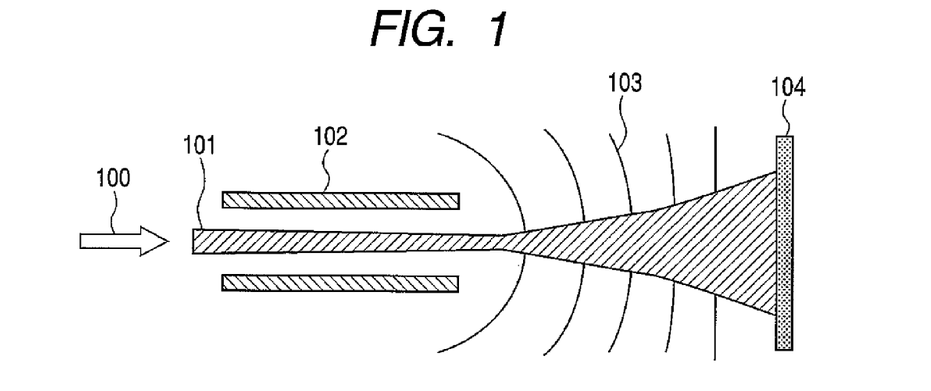

However, for example, when it is assumed that the spin detector using the magnetoresistive sensor shown in FIG. 1 is used for the spin SEM or photoelectron spectroscopy in fact, an acceptance having an electron beam becomes an issue. As usual, in order to greatly create a conductive effect depending on the spin of electrons, the magnetoresistive sensor operates at a low voltage of several eV level. Accordingly, for example, even electrons carried at a high acceleration of several kV level must be decelerated just before the electrons are irradiated to the magnetoresistive sensor. This state is shown in FIG. 1. The direction the electrons travel is indicated by reference numeral 100. An electron optics 102 of a spin polarized electron beam 101 to be measured is at a potential of several kV level, for example, but must be decelerated down to, for example, about 100 V when the spin polarized electron beam 101 is inputted to a magnetic resistive element 104.

Accordingly, when it is assumed that a potential of the magnetoresistive sensor 104 is about 100 V, an equipotential line 103 is created as shown in FIG. 1. As a result, the electron beam per se is spread, and an incident angle to the magnetoresistive sensor 104 becomes discrete. Then, a change in the resistance depending on the spin and a change in the resistance caused by a difference in the travel direction of electrons within the magnetoresistive sensor 104 are mixed together, resulting in the deterioration of the detection sensitivity. Also, in the case where the electron beam per se is spread, since a thickness of one magnetoresistive sensor 104 is different between a center portion and a peripheral portion thereof due to a manufacture variation, there arises such a drawback that a change in the resistance depending on the spin due to the electron beam input to the center portion thereof, and a change in the resistance due to the electron beam input to the peripheral portion become further large as compared with a case where no electron beam is spread.

Accordingly, under the existing circumstances, the detector has no acceptance of the degree that can measure a sufficient amount of electron beam, and can be applied to only the electron beam under the limited conditions. For that reason, the detector has not yet arrived at a spin detector substituted for the Mott detector.

Under the above circumstances, an object of the present invention is to provide an electron spin detector which is capable of resolving the spin of electrons with high efficiency, and being manufactured with a small size and inexpensively with no need to accelerate electron beams up to a level of 100 kV.

In order to solve the above problem, according to one aspect of the present invention, there is provided a spin detector having a plurality of magnetoresistive sensors and a deceleration lens for electron beams in which the magnetoresistive sensors are angled to each other, and applied devices using the spin detector. The plurality of magnetoresistive sensors are arranged to face an incident electron beam. However, since the decelerated electron beam is spread laterally, the electron beam can be input to all of the magnetoresistive sensors at angles close to a normal incidence with a configuration where detection surfaces of the magnetoresistive sensors arranged at locations farther apart from the optical axis are more inclined toward the optical axis side.

Also, according to another aspect of the present invention, there is provided an electron spin detector including a electron optics that accelerates an electron beam emitted from an electron source and carries the electron beam in a given direction, a deceleration lens that decelerates the electron beam that has passed through the electron optics, and a plurality of magnetoresistive sensors that detect the decelerated electron beam. The magnetoresistive sensors are arranged within a virtual plane intersecting the optical axis of the electron optics, and the detection surfaces of the magnetoresistive sensors are arranged toward the electron optics direction in such a manner that an angle formed between a perpendicular to each detection surface of the magnetoresistive sensors and an optically axial direction of the electron optics is larger as the detection surface is farther apart from the optical axis.

Further, according to still another aspect of the present invention, there is provided an electron spin detector including, a electron optics that accelerates an electron beam emitted from an electron source and carries the electron beam in a given direction, a deceleration lens that decelerates the electron beam that has passed through the electron optics, and a plurality of magnetoresistive sensors that detect the decelerated electron beam. The detection surfaces of the magnetoresistive sensors are arranged toward an incoming direction of the electron beam so that a virtual envelop curve coming in contact with each detection surface of the magnetoresistive sensors is of a recess configuration when viewed from the incoming direction.

According to the present invention, there can be provided the electron spin detector that is capable of resolving the spin of electrons with high efficiency, and being manufactured with a small size and inexpensively with no need to accelerate electron beams up to a level of 100 kV.

BRIEF DESCRIPTION OF THE DRAWINGS

FIG. 1 is a diagram assuming a measurement system and an electron orbit when an electron spin detector using a conventional magnetoresistive sensor is applied to a spin SEM or the like;

DETAILED DESCRIPTION OF THE PREFERRED EMBODIMENTS

Figure 2:
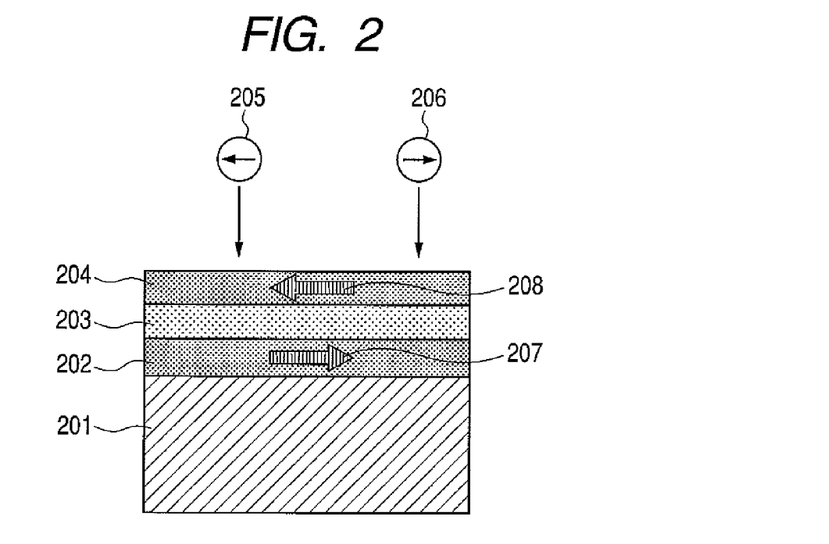
FIG. 2 is a diagram showing one structural example of a magnetoresistive sensor for use in an electron spin detector according to the present invention.

The present invention provides a detector that resolves spin of electrons with high efficiency. Prior to description of various embodiments of the present invention, an example of a basic structure of a magnetoresistive sensor per se with which the present invention is concerned will be described with reference to FIGS. 2 to 4. FIG. 2 shows a structure of a magnetoresistive sensor currently known as a GMR (giant magneto resistance) element. The base includes three films in which a lowest film is a magnetic layer 202 (for example, CoFe, etc.) formed on an underlayer 201, and the magnetization of that layer, that is, the spin polarization is fixed in a given direction due to an interaction with the underlayer 201. On the magnetic layer 201 is formed a nonmagnetic layer 203 made of, for example, Cu or the like and a magnetic layer 204 made of CoFe or the like is formed on the top. An orientation 208 of the spin polarization of the magnetic layer 204 can change depending on the circumstances such as an external magnetic field. Then, a voltage is applied in advance between those two magnetic layers 202 and 204 between which the nonmagnetic layer 203 is held. When the spin polarizations of those magnetic layers 202 and 204 are parallel to each other, the resistance is low, and a large amount of current flows. When the spin polarization is antiparallel, the resistance is high, and the amount of current flowing therein is low. As another magnetoresistive sensor, a TMR (tunneling magneto resistance) element is widely known. This element is also substantially identical in. structure with the above elements, and different therefrom in that the nonmagnetic layer 203 is an insulator made of MgO, for example. The magnetoresistive sensor of this type is used as a memory for recording information therein in the MRAM, etc., and as a read element that detects the external magnetic field in the HDD, by moving the spin polarization of the uppermost magnetic layer 204.

When the magnetoresistive sensor is used as the spin detector, an electron beam to be measured is inputted to the uppermost magnetic layer 204. When the energy of the electron beam is very weak, whether the electron flows as a current flowing into the lower magnetic layer, or not, depends on the orientation of spin of the electron. That is, an electron 206 having a spin whose orientation is parallel to an orientation 207 of the spin polarization within the lower magnetic layer 202 can flow into the lower magnetic layer 202. On the other hand, an electron 205 having a spin whose orientation is antiparallel thereto is difficult to flow. In this way, the orientation of the spin of the incident electron can be detected by detecting the current flowing in the magnetoresistive sensor. Attention must be paid to a fact that when the energy of the incident electron beam is high, the electron beam is caused to suddenly enter the lowermost magnetic layer 202 or its lower portion with the result that a difference of the resistance due to the orientation of the spin cannot be detected. Accordingly, it is preferable that the energy of the incident electron beam is lower.

Figure 3:
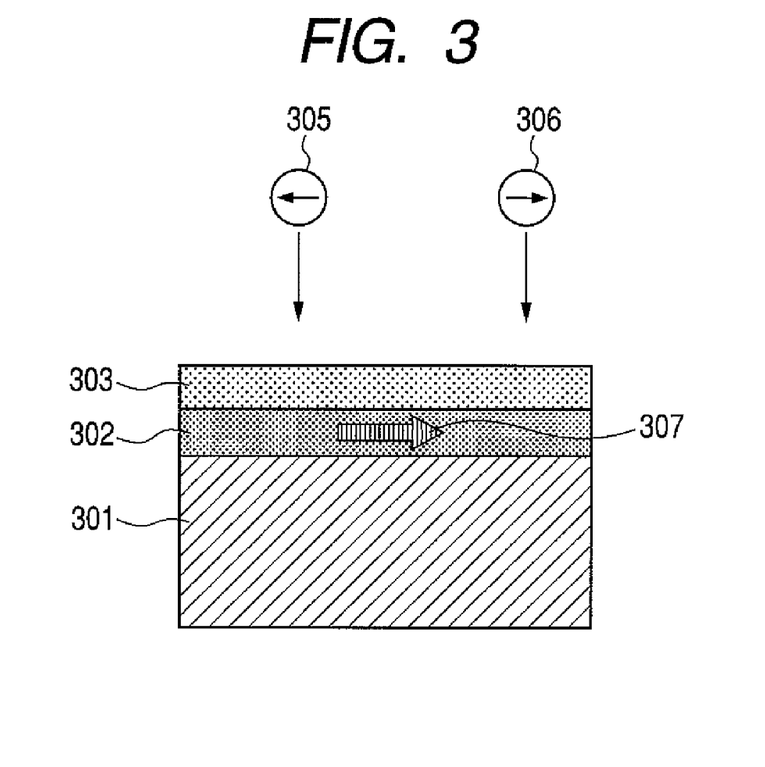
FIG. 3 is a diagram showing another structural example of the magnetoresistive sensor for use in the electron spin detector according to the present invention.
Figure 4:
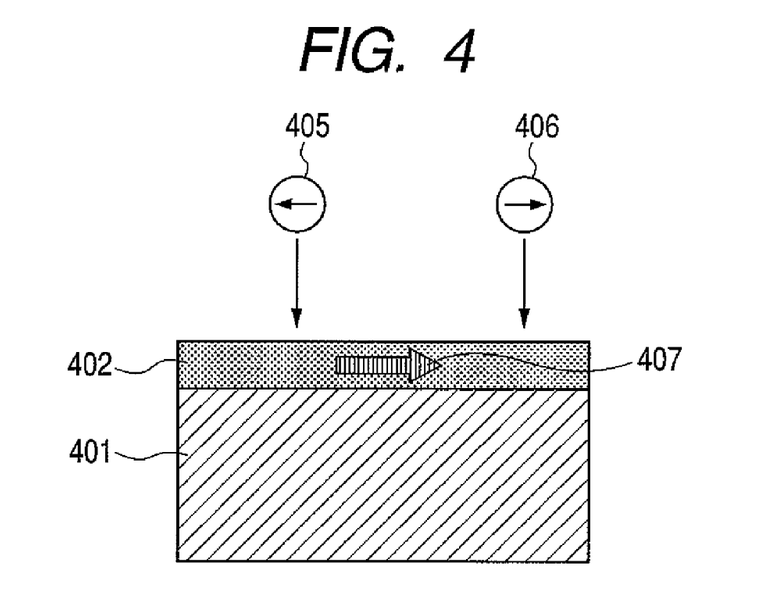
FIG. 4 is a diagram showing still another structural example of the magnetoresistive sensor for use in the electron spin detector according to the present invention.

From the viewpoint of the above-mentioned principle, the magnetoresistive sensor is not always of the three-layer configuration shown in FIG. 2. That is, as shown in FIG. 3, the magnetoresistive sensor may be of a two-layer configuration consisting of a lowermost magnetic layer 302 and a top layer 303 without provision of the uppermost layer. Also, as shown in FIG. 4, the magnetoresistive sensor may be formed of only a lowermost magnetic layer 402 without provision of an intermediate layer. In this case, whether the electron can be input directly to a sample surface from vacuum, or not, is determined according to the orientations of the incident electron and the magnetization of the sample, as with the detection principle of an SPLEEM (spin-polarized low energy electron microscopy) (Journal Of Physics De Applied Physics, Vol. 35, pp. 2327 to 2331 (2002)). This structure is simple, but is lower in detection sensitivity than the three-layer structure. In FIGS. 3 and 4, the same structures as those in FIG. 2 whose description is particularly unnecessary are omitted from description with reference to reference numerals corresponding to FIG. 2.

Figure 5:
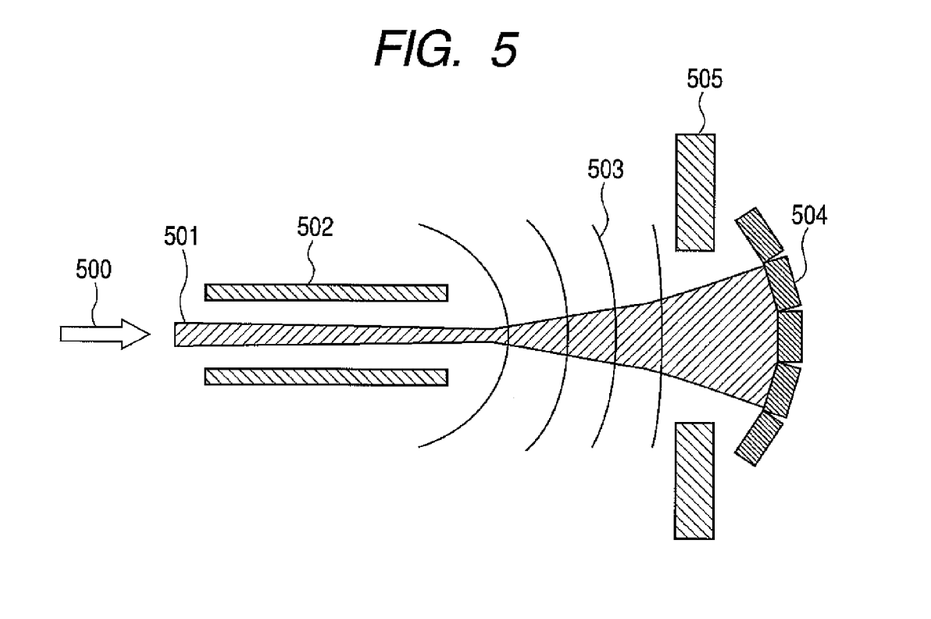
FIG. 5 is a diagram showing an arrangement example of the magnetoresistive sensor and a deceleration lens in the electron spin detector according to the present invention.

FIG. 5 shows a basic structure in which the magnetoresistive sensor is used as a spin detector of an electron beam according to the present invention. An electron beam to be measured 501 is carried in a level of, for example, 10 kV from the left side by an electron optics 502. In this case, with an aim to improve the carrier efficiency of the electron beam, the electron beam needs to be thinly narrowed, and the acceleration voltage needs to be increased to some degree. However, since the energy of the electron beam must be lowered in detecting the orientation of the spin by magnetoresistive sensors 504, a deceleration lens 505 is disposed immediately before the magnetoresistive sensors 504. When the electron beam 501 is decelerated, equipotential lines 503 are curved, as a result of which an open angle of the electron beam becomes larger, and the beam diameter is widened.

Under the circumstances, the magnetoresistive sensors 504 are angled to the electron beam 501 in such a manner that the electron beam 501 can be input substantially perpendicularly to the respective magnetoresistive sensors 503 anywhere. FIG. 5 shows the two-dimensional position of the magnetoresistive sensor 504. In fact, the magnetoresistive sensors 504 are three-dimensionally configured like a parabola antenna. That is, the magnetoresistive sensors 504 are more inclined toward the optical axis as the magnetoresistive sensors 504 are farther apart from the optical axis. A total of signals from the respective magnetoresistive sensors 504 forms a signal for finally detecting the spin polarized degree. It is needless to say that the incidence perpendicular to the magnetoresistive sensors 504 can be more precisely realized by making the magnetoresistive sensors 504 smaller in size and larger in number to produce a smooth parabola antenna configuration. However, since the manufacture and assembly become more difficult, the number of magnetoresistive sensors 504 is determined with the intended detection sensitivity in mind. With this configuration, the spin detector using the magnetoresistive sensors can be also applied to the electron beam that is low in acceleration, large in beam diameter, and large in open angle. Thus, the above configuration can overcome the small acceptance being a weak point of the spin detector.

Figure 6:
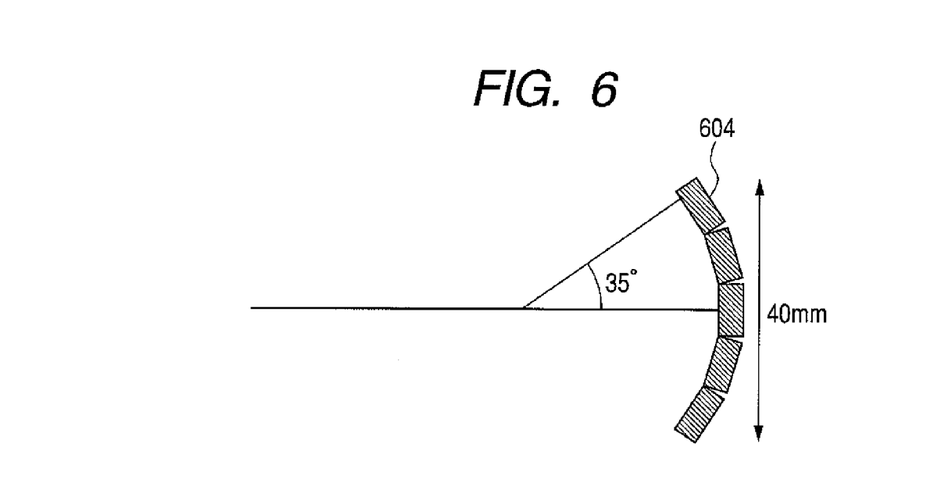
FIG. 6 is a diagram showing an arrangement example of the magnetoresistive sensor in the electron spin detector according to the present invention.

An example of a position and an angle at which the magnetoresistive sensors 604 are actually arranged will be described with reference to FIG. 6. If the spin detector is applied to measurement of a secondary electron spin polarized degree in the spin SEM, it is assumed that the energy when the secondary electrons are carried is 3 kV, the beam diameter is 4 mm, and the open angle is 3.5°, for example. When the energy is decelerated down to about 30 V, the beam diameter becomes about 40 mm, and the open angle becomes about 35°. For that reason, the arrangement shown in FIG. 6 is proposed.

A process of the actually detected signal will be described. As for one of the magnetoresistive sensors, a magnetic resistivity can be defined as follows.

$$R=(R_+-R_-)/(R_++R_-)$$

where $R_+$ is a resistance (higher resistive state) of the electron beam having a spin polarization degree in an orientation opposite to the spin polarization of the lowermost magnetic layer in FIG. 2, and $R_-$ is a resistance (lower resistive state) of the electron beam having a spin polarization degree in an orientation identical with the spin polarization of that magnetic layer. Reference symbol R is a parameter of the sensitivity of the respective magnetoresistive sensors.

The amount to be actually measured is a current detected by the respective magnetoresistive sensors. When it is assumed that the amount of current supplied to the magnetoresistive sensors is $I_0$ (measured by Faraday cup in advance), and a current detected by the magnetoresistive sensors is $I_D$, a spin polarization degree P of the incident electron beam to be obtained is represented as follows.

$$P=(I_D/I_0-B)/C$$

where B is an offset value set so that the spin polarization degree becomes zero when the non-polarized electron beam is inputted to the magnetoresistive sensors, where C is a constant depending on the sensitivity of the respective magnetoresistive sensors, and proportional to R of the respective magnetoresistive sensors. A value resulting from averaging all of P obtained in the respective magnetoresistive sensors is the spin polarization degree.

Hereinafter, the same structures as those in FIG. 5 whose description is unnecessary are omitted from description with reference to reference numerals corresponding to FIG. 5.

Figure 7:
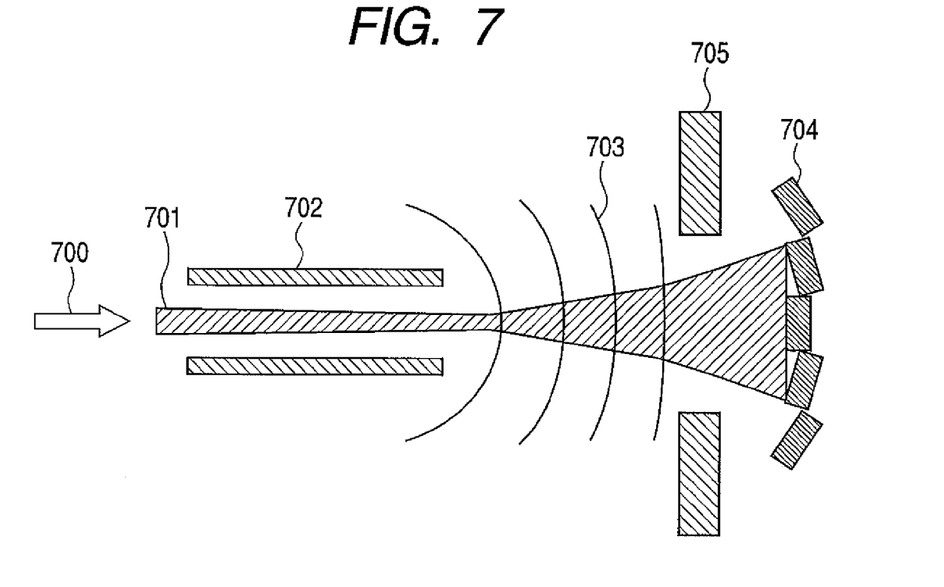
FIG. 7 is a diagram showing an arrangement example of the magnetoresistive sensor and the deceleration lens in the electron spin detector according to the present invention.

FIG. 7 shows an embodiment of the present invention. The detection surfaces per se of the magnetoresistive sensors 704 are inclined, but the magnetoresistive sensors 704 are arranged on a plane unlike the arrangement of the parabola antenna configuration shown in FIG. 5. This arrangement is advantageous in that the volume of the entire spin detector can be reduced. The detection sensitivity per se is not substantially different from that in the embodiment of FIG. 5.

Figure 8:
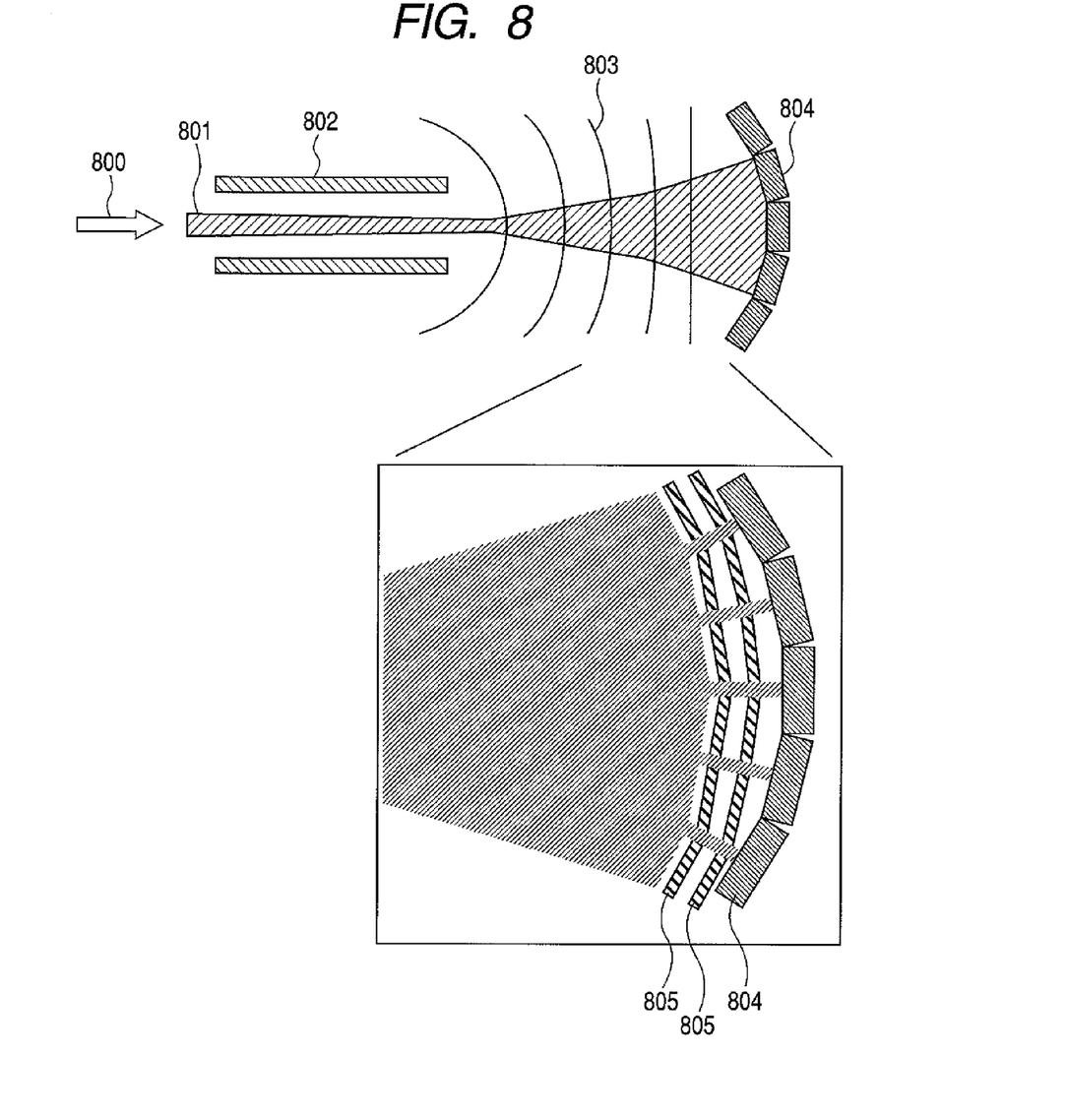
FIG. 8 is a diagram showing an arrangement example of the magnetoresistive sensor and the deceleration lens in the electron spin detector according to the present invention (apertures are defined in front of the magnetoresistive sensor)

FIG. 8 shows another embodiment of the present invention. The deceleration lens is omitted from this drawing. This embodiment basically has the same configuration as that of the embodiment shown in FIG. 5, but is different therefrom in that an aperture 805 is disposed in front of each magnetoresistive sensor 804. Each aperture has a hole smaller than the size of each magnetoresistive sensor, which corresponds to each magnetoresistive sensor. For that reason, a part of the incident electron beam 801 is cut off, but only electrons that are inputted more perpendicularly to the magnetoresistive sensors are selectively detected. This embodiment is effective when the number of electron beams is larger, and a variation in the incident angle is intended, to be suppressed as much as possible.

Figure 9:
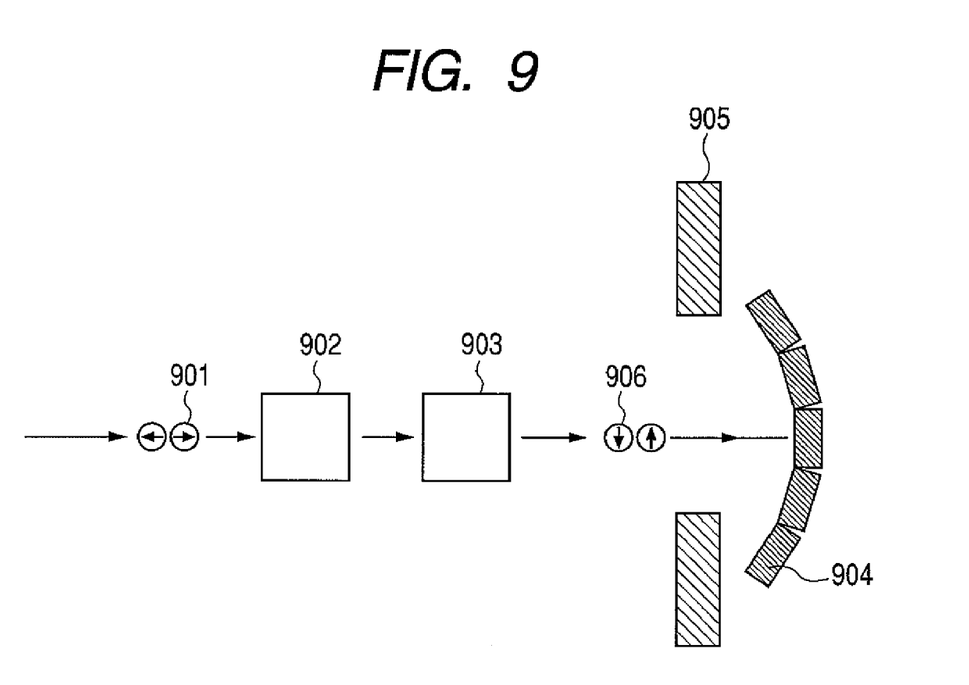
FIG. 9 is a diagram showing an arrangement example of the magnetoresistive sensor and the deceleration lens in the electron spin detector according to the present invention (combined with two spin rotators)

FIG. 9 shows still another embodiment. In the above-described manner, only the spin in the spin polarization direction of the magnetic film of the magnetoresistive sensor can be resolved. In order that the electron spin detector of the present invention resolves spin in other directions, it is necessary to rotate spin from the undetectable direction to the detectable direction before incidence of electrons. One or two spin rotators (902 and 903) performing the above function are arranged in front of the electron spin detector of the present invention, thereby enabling spin in other directions to be also detected.

As the spin rotator, there are proposed a spin rotator having the same structure as that of an energy analyzer called "Wien filter" in which an electric field and a magnetic field are orthogonal to each other and an electron orbit (Review of Scientific Instrument 75, p 2003 (2004)), and a solenoid coil. The combination of two Wien filters or the combination of the Wien filter type and the solenoid type enables the electron spin facing in any direction to turn in a direction in which the spin can be detected by the electron spin detector of the present invention.

For example, it is assumed that the spin polarization direction of the magnetic film of the magnetoresistive sensor, is a longitudinal direction 906 on the paper plane, and an orientation of spin of the incident electron is a direction 901 parallel to the electron orbit in FIG. 9. In this case, the electron spin is rotated in the longitudinal direction on the paper plane by the spin rotators 902 and 903, thereby enabling a spin component parallel to the electron orbit to be detected. Also, when the electron spin is rotated by 90° around the electron orbit direciton, the spin component in a direction perpendicular to the paper plane can be detected. The spins in the above three directions are detected, thereby making it possible to detect the orientation of the spin of electrons three-dimensionally.

Figure 10:
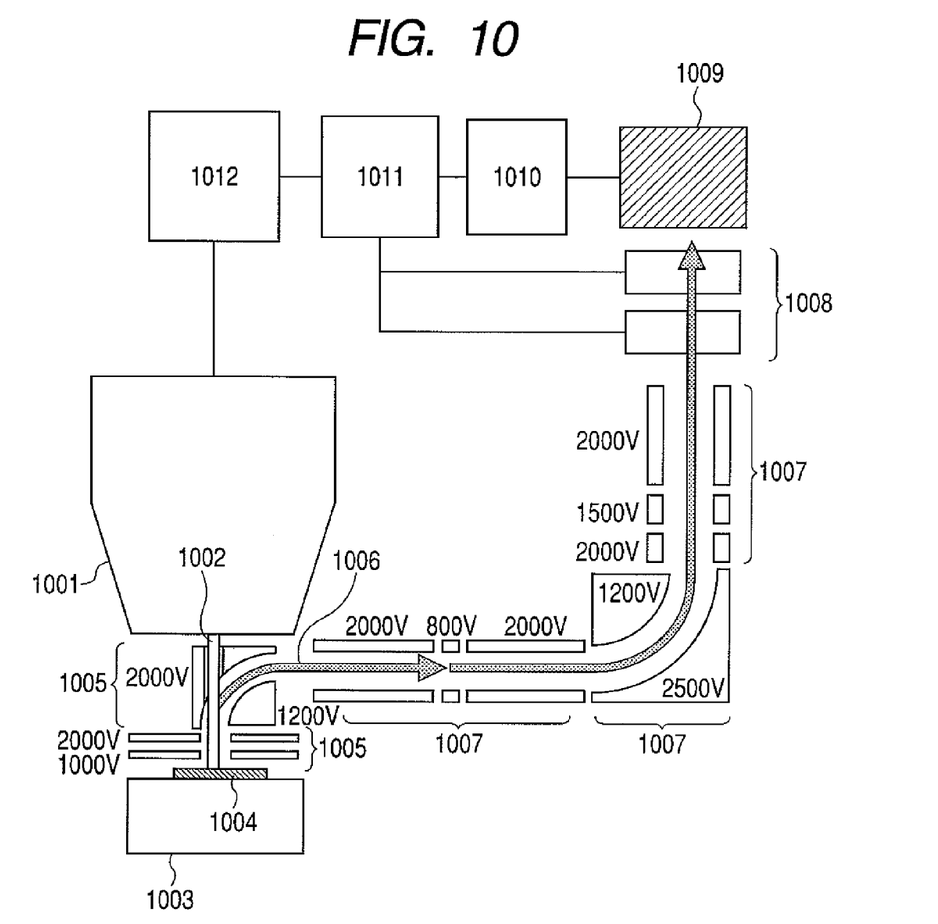
FIG. 10 is a diagram showing a configuration example in which the electron spin detector of the present invention is applied to a spin polarized scanning electron microscope.

FIG. 10 shows an embodiment of a spin polarized scanning electron microscope on which the electron spin detector of the present invention is mounted. The spin polarized, scanning electron microscope is a device that obtains a domain image by mapping the spin polarization degree of secondary electrons emitted, from a magnetic sample, and its outline is disclosed in JP-A-60-177539) and so on. A primary electron beam 1002 emitted from an electron gun 1001 is irradiated to a sample 1004 set on a sample stage 1003. This process is the same as that of the normal SEM. However, in the spin polarized scanning electron microscope, it is necessary that a secondary electron condensing lens system 1005 is disposed in the vicinity of the sample, secondary electrons 1006 of the number as large as possible are carried to resolve spins of those electrons. For that reason, it is necessary that a secondary electron optics 1007 that carries the secondary electron 1006 is arranged, and the secondary electron 1006 is carried to the spin detection system while adjusting the lens characteristic of those optical systems. An example of a voltage to be applied to each electron lens of the secondary electron optics 1005 and 1007 is shown in FIG. 10.

The secondary electron 1006 thereafter arrives at a spin rotator 1008, and a component of the electron spin to be detected is rotated in a direction in which the electron spin is detectable by an electron spin detector 1009. Thereafter, the secondary electron 1006 is carried to the electron spin detector 1009. When two of the spin rotators 1008 are mounted as described above, spin in any direction can be faced in a detectable direction. A signal from the electron spin detector 1009 is inputted to a signal analyzing system 1010 to create a domain image in the data acquisition and display system 1011. The data acquisition and display system 1011 also controls the spin rotator so as to selectively create a picture of the spin in any direction.

Also, the data acquisition and display system 1011 is also connected to an electron beam controller 1012 that controls the electron gun 1001, and creates a domain image by creating a fusion of a position of the primary electron beam 1002 on the sample and a signal from the signal analyzing system 1010. A vacuum chamber is omitted from the drawing, which covers the primary electron beam 1002, the sample stage 1003, the sample 1004, the secondary electron 1006, the secondary electron condensing lens system 1005, the secondary electron optics 1007, the spin rotator 1008, and the electron spin detector 1009. The above-mentioned spin polarized scanning electron microscope is a technique already reported, but the electron spin detector 1009 of the present invention is mounted on the spin polarized scanning electron microscope, thereby enabling data remarkably excellent in S/N as compared with the conventional art to be obtained, and a large volume of data to be obtained in a short time.

Figure 11:
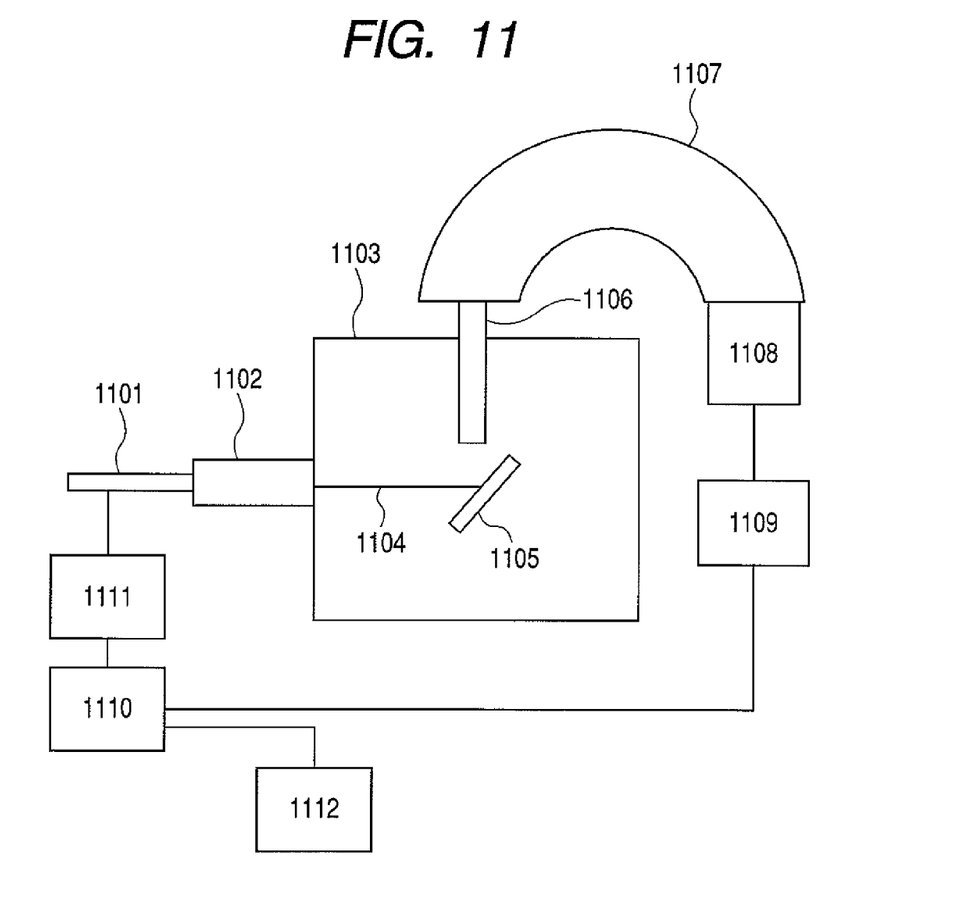
FIG. 11 is a diagram showing a configuration example in which the electron spin detector of the present invention is applied to a spin-resolved X-ray photoelectron spectroscope.

FIG. 11 shows a photoemission spectrometer on which the electron spin detector of the present invention is mounted. An electromagnetic ray 1104 emitted from a light source 1101 passes through a condensing lens system 1102, and thereafter is irradiated to a sample 1105 set inside of an ultrahigh vacuum chamber 1103. As a result, an excited photoelectron is condensed by an electron lens 1106, and passes through an energy analyzer 1107 that carries the photoelectron having a desired energy in a given direction, and is thereafter input to an electron spin detector 1108. A signal from the electron spin detector 1108 passes through a signal analyzing system 1109 and a system controller 1110, and is then saved in a data storage 1112. Also, the system controller 1110 controls a light source controller 1111. This system is well known as a spin resolved photoemission spectroscopy (Japanese Journal of Applied Physics 35, p. 6314 (1996)). Conventionally, a Mott detector has been used as the electron spin detector 1108, and its sensitivity is insufficient. The electron spin detector 1108 of the present invention is mounted, thereby making it possible to obtain data remarkably excellent in S/N as compared with the conventional art, and also to obtain a large volume of data in a short time.

What is claimed is:

1. An electron spin detector, comprising:
   an electron optics that accelerates an electron beam emitted from an electron source and carries the electron beam in a given direction;
   a deceleration lens that decelerates the electron beam that has passed through the electron optics; and
   a plurality of magnetoresistive sensors that detect the decelerated electron beam,
   wherein the detection surfaces of the magnetoresistive sensors are arranged toward an incoming direction of the electron beam so that a virtual envelop curve coming in contact with each detection surface of the magnetoresistive sensors is of a recess configuration when viewed from the incoming direction.

2. The electron spin detector according to claim 1, wherein the plurality of magnetoresistive sensors are arranged immediately after the deceleration lens.

3. The electron spin detector according to claim 1 wherein the plurality of magnetoresistive sensors are arranged at different angles to the optical axis of the electron optics so that the electron beam spread by the deceleration lens is inputted substantially perpendicular to each of the plurality of magnetoresistive sensors.

4. The electron spin detector according to claim 3, wherein the angle is more inclined toward the optical axis as the magnetoresistive sensors are farther apart from the optical axis of the electron optics.

5. The electron spin detector according to claim 1, wherein an aperture has a hole smaller than the size of each magnetoresistive sensor on the incoming direction side of the plurality of magnetoresistive sensors, which faces to each magnetoresistive sensor.

6. The electron spin detector according to claim 1, wherein a unit for rotating an orientation of the electron spin of the electron beam is disposed in front of the plurality of magnetoresistive sensors to which the electron beam is inputted.

7. The electron spin detector according to claim 6, wherein the unit for rotating the orientation of the electron spin of the electron beam includes at least one Wien filter type having a mechanism in which an electric field and a magnetic field are orthogonal to each other.

8. The electron spin detector according to claim 1, wherein two units for rotating an orientation of the electron spin of the electron beam are disposed in front of the plurality of magnetoresistive sensors to which the electron beam is inputted.

9. An electron spin detector, comprising:
   an electron optics that accelerates an electron beam emitted from an electron source and carries the electron beam in a given direction;

a deceleration lens that decelerates the electron beam that has passed through the electron optics; and a plurality of magnetoresistive sensors that detect the decelerated electron beam, wherein the magnetoresistive sensors are arranged within a virtual plane intersecting the optical axis of the electron optics, and wherein the detection surfaces of the magnetoresistive sensors are arranged toward the electron optics in such a manner that an angle formed between a perpendicular to each detection surface of the magnetoresistive sensors and an optically axial direction of the electron optics is larger as the detection surface is farther apart from the optical axis.

10. A spin polarized scanning electron microscope, comprising:

an electron gun that emits an electron beam;

a primary electron beam emitted from the electron gun and irradiated on a sample mounted on a sample stage;

a secondary electron beam emitted from the sample surface by irradiation of the primary electron beam;

a secondary electron optics that accelerates the secondary electron beam and carries the secondary electron beam in a given direction; and a spin rotator that changes the electron spin rotation of the electron beam that has passed through the secondary electron optics, wherein the electron spin detector according to claim 1 is used for the detector that detects the electron beam that has passed through the spin rotator.

11. A spin resolved photoemission spectrometer, comprising:

a light source that emits an electromagnetic ray;

a condensing lens system that is disposed inside an ultra-high vacuum chamber and carries the electromagnetic ray to be irradiated to a sample;

an electron lens that condenses a photoelectron excited by irradiation on the sample; and an energy analyzer that carries a photoelectron having a desired energy among the condensed photoelectrons in a given direction, wherein the electron spin detector according to claim 1 is used for the detector that detects the photoelectron that has passed through the energy analyzer.

* * * * *